United States Patent [19]
Rosnowski

[11] 4,029,528
[45] June 14, 1977

[54] METHOD OF SELECTIVELY DOPING A SEMICONDUCTOR BODY

[75] Inventor: Wojciech Rosnowski, Summit, N.J.

[73] Assignee: RCA Corporation, New York, N.Y.

[22] Filed: Aug. 30, 1976

[21] Appl. No.: 718,806

[52] U.S. Cl. .................................. 148/187; 148/189
[51] Int. Cl.² ..................................... H01L 21/223
[58] Field of Search ........................... 148/189, 187

[56] References Cited

UNITED STATES PATENTS

| | | | |
|---|---|---|---|
| 3,437,533 | 4/1969 | Dingwall | 148/187 |
| 3,468,017 | 9/1969 | Stacey et al. | 29/571 |
| 3,560,280 | 2/1971 | Nishida | 156/17 |
| 3,562,033 | 2/1971 | Jansen et al. | 148/189 |
| 3,589,953 | 6/1971 | Traxler | 148/189 |
| 3,615,945 | 10/1971 | Yokozawa | 148/186 X |
| 3,681,155 | 8/1972 | Elgan et al. | 148/188 |
| 3,798,079 | 3/1974 | Chu | 148/33.5 |
| 3,997,379 | 12/1976 | Rosnowski | 148/189 |

*Primary Examiner*—G. Ozaki
*Attorney, Agent, or Firm*—H. Christoffersen; R. P. Williams; R. A. Hays

[57] ABSTRACT

A method of selectively doping a semiconductor body with aluminum impurities comprises the step of forming a layer of silicon dioxide which is thick enough so that during the diffusion a masking portion of aluminum oxide is formed therein. The aluminum oxide formed serves as a mask against the penetration of aluminum impurities through the remaining silicon dioxide therebelow.

5 Claims, 4 Drawing Figures

METHOD OF SELECTIVELY DOPING A SEMICONDUCTOR BODY

The present novel method generally relates to the selective doping of a semiconductor body and, in particular, relates to the selective doping of a silicon body with aluminum impurities.

Present methods of selectively doping semiconductor bodies with aluminum impurities employ various materials as diffusion masks. Generally the masking material is something other than silicon dioxide, such as, for example, silicon nitride. Although silicon dioxide is occasionally used in conjunction with another material to mask a silicon body against aluminum impurities, it is a generally held belief that silicon dioxide alone cannot be an effective mask. Indeed it has been stated that boron (presently the commonly used P-type dopant) is unattractive as a dopant and is used because it is the only P-type dopant that can be effectively masked by silicon dioxide; see the article entitled, COMPATIBILITY OF OXIDE PASSIVATION AND PLANAR JUNCTION WITH Al, Ga AND P DIFFUSIONS, by Rai-Choudhury, Kao and Sweeney; Journal of Electrical Chemical Society, page 1510, November, 1974. As known in the art, aluminum, because it has a better lattice match with silicon and thus causes fewer atomic disturbances when diffused therein, is preferred over boron as a P-type dopant. Further, silicon dioxide, because of its relative ease of removal from a silicon surface and because the technology associated therewith is comparatively much more advanced, is preferred over silicon nitride, for example. Silicon nitride, presently the most commonly used aluminum mask is more difficult to define and remove.

The present method, contrary to the general notions in the art, uses aluminum as a P-type dopant and only silicon dioxide as a masking material therefor.

Figure 1:
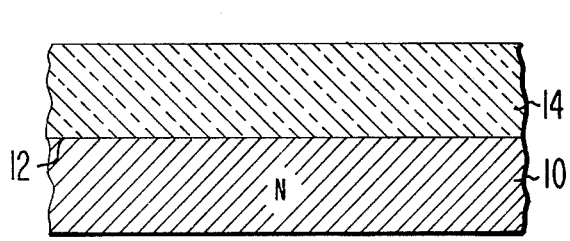
FIGS. 1 through 3 are cross-sectional views of a portion of a silicon body at sequential phases of the present method, not drawn to scale.

The initial workpiece of the present method is a portion of a body of semiconductor material, indicated generally at 10 in the drawings, having a major surface 12. Although shown and described as having N-type conductivity, the conductivity type of the portion 10 is substantially immaterial to the practice of the present method. The semiconductor portion 10 is silicon. As shown in FIG. 1 a layer 14 of silicon dioxide is formed on the surface 12. As discussed more fully below, the layer 14 is preferably on the order of about 40,000 A thick. The silicon dioxide can be either thermally grown or pyrolytically formed. Preferably the layer 14 is thermally grown because the resulting material is comparatively denser than if pyrolytically formed and, thus, does not need to be annealed. A 40,000 A layer of silicon dioxide may be thermally grown by exposing the portion 10 to an atmosphere of steam at a temperature of between from about 1000° C. to about 1200° C., for a period of time on the order of between about 50 hours to about 17 hours, respectively. Preferably the exposure is at a temperature of about 1200° C. for a period of about 17 hours. The body is then slowly cooled, i.e., cooled at a rate on the order of about 2° C. per minute, to a temperature of about 870° C. The body is then slowly removed from the oven, i.e., withdrawn from the oven over a period of about 5 minutes. Such a layer 14 has been found to be substantially free of cracks and other damage.

Figure 2:
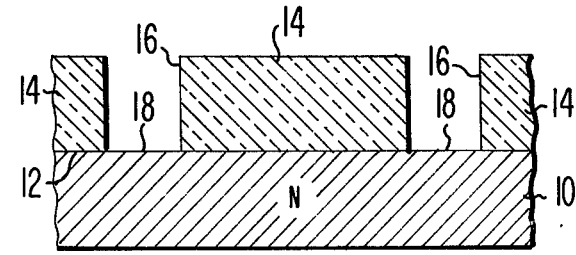

The silicon dioxide layer 14 is then patterned, or defined, as shown in FIG. 2, using conventional methods, such as photolithographic and etching techniques. The defining step results in a preselected plurality of openings 16 in the layer 14 of silicon dioxide which expose portions 18 of the semiconductor surface 12.

Next, using an aluminum-silicon alloy comprising about 37% aluminum and 63% silicon as an impurity source, the portion 10 is exposed to aluminum impurities in a conventional vacuum system. The diffusion may take place at a temperature between from about 1025° C. to about 1175° C. It is preferred that the diffusion temperature be about 1150° C. For example, it has been determined that under these conditions, if the diffusion continues for a period of on the order of about 3 hours, a pocket 20 having a pre-drive in depth of about 17 microns deep and having a surface impurity concentration on the order of about $5 \times 10^{18}$ atoms/cm$^3$ is formed beneath the exposed surface portions 18. The particular surface impurity concentration selected is dependent upon the final use of the device and determined by conventional design considerations. This is also true for the pre-drive-in depth of the pocket 20 since this depth is a major contributing factor to the final impurity concentration profile and depth. That is, for equal drive-in cycles the pre-drive-in depth for a profile containing more impurities is greater than pre-drive-in for a profile containing less impurities. It is a known consideration that the greater the diffusion time the deeper the pre-drive-in pocket 20. It has also been determined that under the above conditions the layer 14 of silicon dioxide, having a thickness on the order of about 40,000 A, completely prevents aluminum impurities from penetrating the surface 12 which remains covered by the layer 14 of silicon dioxide.

Figure 3:
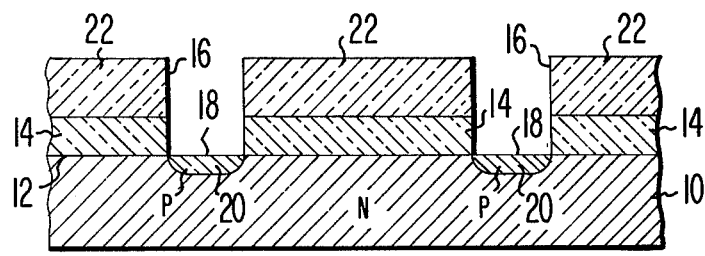

The masking mechanism is best understood by referring to FIG. 3 which shows the portion 10 after diffusion has been completed. Therein it is shown that the upper portion 22 of the layer 14 of silicon dioxide has been chemically converted to aluminum oxide. The upper portion 22 of the layer 14 of silicon dioxide (SiO$_2$) is presumedly converted to aluminum oxide (Al$_2$O$_3$) by the thermodynamically favored reaction:

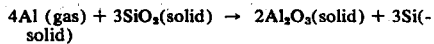

4Al (gas) + 3SiO$_2$(solid) → 2Al$_2$O$_3$(solid) + 3Si(solid)

It has been found that aluminum diffuses relatively slower through aluminum oxide (Al$_2$O$_3$) compared to its diffusion through silicon (Si). Hence, the aluminum oxide (Al$_2$O$_3$) serves as a mask against aluminum diffusion providing the diffusion time into the silicon to form the pocket 20 is shorter than the time it takes to completely convert the layer 14 to aluminum oxide. It is necessary to maintain some unconverted silicon dioxide on the surface 12 since aluminum (Al$_2$O$_3$) in contact with silicon serves as an aluminum diffusion source rather than a mask. While the exact thickness of silicon dioxide needed in each particular case is not known, the graph of FIG. 4 indicates some thicknesses for a particular surface impurity concentration of aluminum in silicon. The graph is more fully explained below.

In addition to the above reaction which results in the formation of the aluminum oxide (Al$_2$O$_3$) another reaction i.e., $SiO_2(solid) + 2Al(gas) \rightarrow SiO(gas) + Al_2O(gas)$ also takes place during the diffusion. This is a surface controlled reaction, i.e., it occurs where the aluminum gas contacts the silicon dioxide, which primarily serves only to reduce the thickness of the layer 14. The extent to which this reaction reduces the layer 14 is not completely known but it is compensated for by a relatively thick, i.e., about 40,000 A, layer 14 of silicon dioxide.

This remaining layer 14 of silicon dioxide between the aluminum oxide 22 and the silicon surface 12 is also advantageous for the removal of the layer 14. Upon completion of the diffusion, the final step in the process of selective doping a silicon body with aluminum impurities is to remove the layer 14 from the surface 12. Since there is a layer 14 of silicon dioxide next to a surface 12 of the portion 10, conventional methods may be utilized to remove the masking layer. The remaining steps in the fabrication of a semiconductor device, including the impurity drive-in step, may be performed using conventional techniques.

Figure 4:
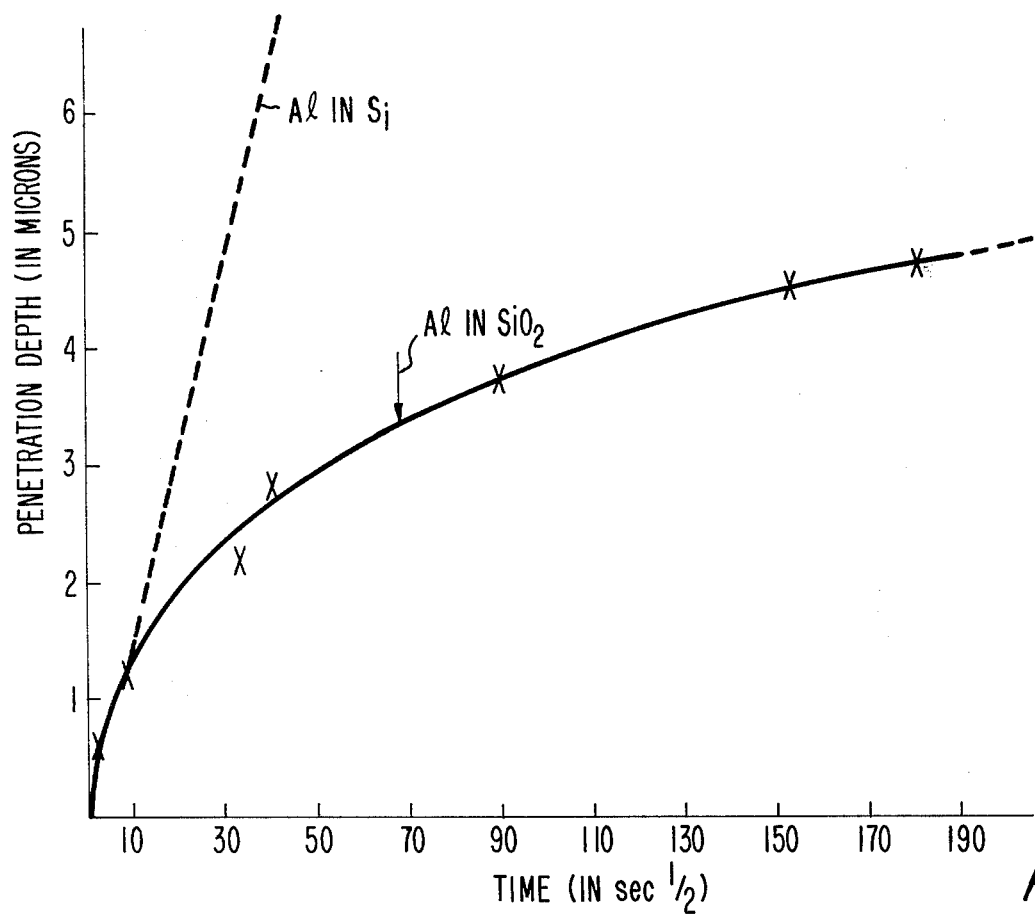
FIG. 4 is a graph showing the interrelationships of various parameters of the present method.

FIG. 4 graphically shows the relationship between the penetration of aluminum impurities in silicon dioxide versus the square root of time at a temperature of 1150° C. The X's indicate the experimental points on the graph. The experimental points were determined under conditions wherein a surface impurity concentration through the exposed portions 18 of the surface 14 was on the order of between from about $5 \times 10^{17}$ atoms/cm$^3$ to about $5 \times 10^{18}$ atoms/cm$^3$. Additionally, the graph shows the aluminum impurity penetration in silicon. The aluminum impurity penetration into silicon graph indicates a linear relationship with the square root of time. While diffusion in any particular material is ordinarily a linear relationship with the square root of time this is not the case with aluminum diffusion in silicon dioxide. That is, as the aluminum oxide increases in thickness the penetration of aluminum into the total layer 14 decreases per unit time.

Under the following conditions
total diffusion time = 5 hours
diffusion temperature = 1150° C.
penetration into exposed silicon ≈ 20 microns
surface concentration in the silicon = between about $1 \times 10^{17}$ atoms/cm and $5 \times 10^{18}$ atoms/cm it has been determined that a layer 14 of silicon dioxide having a thickness of about 35,000 A fails while a layer 14 having a thickness of about 44,000 A completely masks aluminum impurities. A layer is considered to fail when aluminum impurities diffuse completely through the oxide layer and penetrate the silicon surface.

The present method allows the use of silicon dioxide masking for the selective diffusion of aluminum impurities into a silicon body. Silicon dioxide masking is advantageous over silicon nitride masking, for example in that it is easily removed and does not stain the silicon surface 12. Furthermore, the techniques available for use with silicon dioxide are much more advanced at the present time than those involving use of silicon nitride. Thus the use of aluminum as a P-type dopant, with its attendant advantages, is compatible, via the present novel method, with the present techniques used in the fabrication of semiconductor devices.

What is claimed is:

1. A method of selectively doping a silicon body with aluminum impurities comprising the steps of:
   forming a layer of silicon dioxide on a surface of said body;
   selectively exposing portions of said surface through said layer; and
   subjecting said body to aluminum impurities at a temperature and for a time to form a pocket having a preselected surface impurity concentration and pre-drive in depth beneath said portions of said surface, said layer having a thickness such that said impurities are prevented from reaching said surface therebeneath.

2. A method as claimed in claim 1 wherein:
   said layer forming step is carried out until said layer has a thickness of about 40,000 A.

3. A method as claimed in claim 1 wherein said layer forming step comprises the steps of:
   exposing said silicon body to an atmosphere of steam at a temperature of about 1200° C for about 17 hours; and
   cooling said body to a temperature of about 870° C at a rate of about 2° C/minute.

4. A method as claimed in claim 1 wherein:
   said subjecting step is carried out at a temperature between about 1025° C to about 1175° C.

5. A method as claimed in claim 1 wherein:
   said subjecting step is carried out at about 1150° C for about 3 hours.

* * * * *

Disclaimer 4,029,528.—*Wojciech Rosnowski*, Summit, N.J. METHOD OF SELECTIVELY DOPING A SEMICONDUCTOR BODY. Patent dated June 14, 1977. Disclaimer filed Apr. 28, 1980, by the assignee, *RCA Corporation*.

Hereby enters this disclaimer to claim 1 of said patent.

[*Official Gazette, June 17, 1980.*]